PROTECTIVE CIRCUITRY FOR HIGH FIDELITY AMPLIFIER

Filed July 13, 1967

INVENTOR
DAVID L. CAMPBELL
BY Hurwitz, Rose & Greene
ATTORNEYS

United States Patent Office
3,526,846
Patented Sept. 1, 1970

3,526,846 PROTECTIVE CIRCUITRY FOR HIGH FIDELITY AMPLIFIER

David L. Campbell, Santa Clara, Calif., assignor to McIntosh Laboratory, Inc., Binghamton, N.Y., a corporation of Delaware Filed July 13, 1967, Ser. No. 662,242
(Filed under Rule 47(b) and 35 U.S.C. 118)
Int. Cl. H03f 3/42, 3/18, 3/26
U.S. Cl. 330—11 11 Claims

ABSTRACT OF THE DISCLOSURE

A class B power amplifier employing series connected power transistors to the junction of which a load is directly connected. The power transistors are NPN, and from the emitter of one and from the collector of the other, to the load, are connected small current sensing resistors. These sense current in the load, for each polarity of the input signal. In addition, functions of the voltages across the power transistors are sensed in terms of voltages across these resistances and the load. Control transistors are connected to bypass input signal to the power transistors, respectively, instantaneously whenever the combination of voltage across either of the transistors and current therethrough exceeds a combination of values providing safe operating conditions. The desired function is accomplished by a Wheatstone bridge having a fixed current sensing resistance and the load as one arm and a voltage divider as the other, and the control transistor connected with its base-emitter junction across conjugate points of the bridge, to sense unbalance.

BACKGROUND OF THE INVENTION

The object of the invention is to control an input or source current as seen at the input of a Class B power amplifier employing series connected transistors, so that the transistors of the amplifier will always operate within their power dissipation capabilities and within safe operating conditions in respect to combinations of voltage across the transistors and current through these. If safe values are exceeded, source current is reduced only to the level required to bring operation within safe limits, and the operation is instantaneous and occurs only while safe operating conditions are nearly exceeded, even if this occurs for a portion of a cycle of input, or on a transient basis.

The general concept of bypassing the input signal source when the combination of current through and the voltage across a power output transistor exceeds safe limits, is found in the U.S. patent to Chou 3,233,155. The distinction in the present application over the circuit taught by Chou resides in the character of the sensing circuit employed.

Applicant's system employs a Wheatstone bridge arrangement, of which the amplifier load and a fixed resistance in series therewith represents one arm of the bridge, and a voltage divider the other arm, conjugate points of the bridge being connected across the base-emitter junction of a transistor which serves to bypass signal input current to the amplifier when the bridge is sufficiently unbalanced in the correct sense. Unbalance can occur in the correct sense due to decrease of load resistance.

SUMMARY OF THE INVENTION

The invention generally relates to overload protection circuitry for power transistors, and more particularly to overload protection for series connected transistors, operated Class B, which feed a single ended load from their junction. The system senses voltage across each transistor and current therethrough, and operates a protective circuit to shunt a single ended signal input circuit on an instantaneous basis while safe operating conditions are exceeded. Fuses are not sufficiently rapid in operation, for the purpose, and insertion of current limiting impedances is unsatisfactory since distortion may occur or the operating characteristics of the transistors prejudiced.

Considering one side of a Class B amplifier, a small fixed resistance is connected in series between a power transistor and a load. A voltage divider is connected across the fixed resistance and load to provide a Wheatstone bridge. An input signal bypass transistor has its emitter-base resistance connected across conjugate points of the bridge and its collector is connected to bypass signal input current. Assuming the fixed resistance to be $R_3$ and the load resistance $R_L$, and the voltage divider to comprise resistances $R_5$ and $R_6$. For this discussion we can consider diode $D_2$ a short circuit. The ratio of $R_5$ to $R_6$ is selected in relation to the ratio of $R_3$ to $R_L$ such that the base-emitter bias voltage of the bypass transistor is smaller than is required to turn that transistor on by some small fixed value, which may be .55 v. or .7 v. For normal conditions the bypass transistor is non-conductive but if load resistance decreases sufficiently the bridge becomes unbalanced sufficiently to render the bypass transistor conductive, and signal input current is shunted.

DESCRIPTION OF THE PREFERRED EMBODIMENTS

Figures 1, 2:
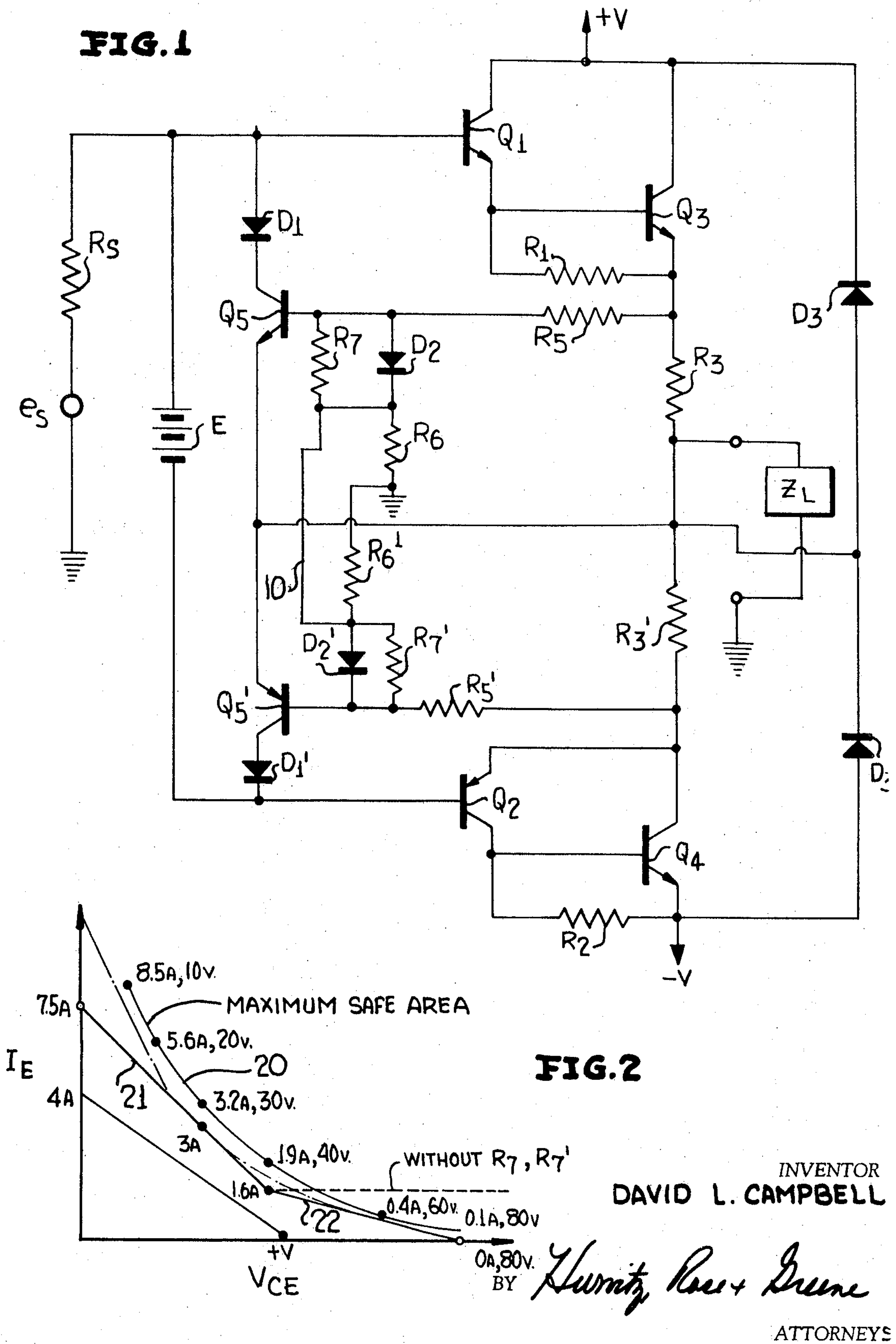
FIG. 1 is a schematic circuit diagram of an amplifier according to the invention.
FIG. 2 is a plot of certain operating characteristics of the amplifier.

In FIG. 1, $e_s$ is a signal source, providing wide band audio signals, usually from a pre-amplifier. The source $e_s$ drives the bases of NPN and PNP transistors $Q_1$ and $Q_2$ cophasally via a base current limiting resistance RS which normally is included as part of source $e_s$. Transistors $Q_1$ and $Q_2$ provide output currents on alternate polarity signals, respectively, since they are of complementary types, and operate as a known form of phase splitter. Battery E establishes a necessary differential.

The collector of driver transistor $Q_1$ is connected to voltage source +V and its emitter is connected directly to the base of NPN power output transistor $Q_3$. $Q_1$ thus acts as a driver for $Q_3$, and $R_1$ discharges stored charge in the base-emitter junction of $Q_3$ at high frequencies. $Q_3$ has its collector directly connected to +V (40 v.) and its emitter connected through a small resistance $R_3$ (.56Ω) to the ungrounded side of speaker load $Z_L$. The load is also connected via resistance $R_3'$ to the collector of NPN power output transistor $Q_4$, driven by a PNP driver transistor $Q_2$ and resistance $R_2$ (27Ω) connects the emitter of $Q_4$ to the base of $Q_4$, opearting like $R_1$. The emitter of $Q_4$ is connected to voltage source −V (−40 v.).

Apart from the presence of resistances $R_3$ and $R_3'$, the amplifier is conventional, as described to this point, and is known as a quasi-complementary output circuit. While the invention is described as applicable to a quasi-complementary output circuit, the principles of the invention are equally applicable to other types of output circuit, i.e. single-ended instead of push-pull, or push-pull amplifiers in which the output transistors are of complementary types, so that two collectors are connected directly to the load. The principles of invention are applicable broadly to a wide range of transistor protective circuits.

The purpose of the invention is to restrict the operating conditions of $Q_3$ and $Q_4$ within their power dissipation capabilities and safe operating area. We consider one half of the amplifier. To this end one senses the voltage at the emitter of $Q_3$, $V_e$, i.e. across $R_3$ and $Z_L$. This voltage equals $V_L+I_eR_3$ where $V_L$ is the voltage across the load $Z_L$ and $I_E$ is emitter current. This voltage $V_e$ drives an attenuator or voltage divider composed of resistance $R_5$ and $R_6$ (taking diode $D_2$ as a short circuit for the present). The junction of $R_5$ and $R_6$ is connected to the base of an NPN control transistor $Q_5$, the emitter of which is connected back to $Z_L$ and the collector of which is connected to the base of $Q_1$. The ratio of $R_5$, $R_6$ is selected in relation to the value of $R_3$ and $R_L$ such that the base-emitter voltage of $Q_5$ is smaller than is required to turn $Q_5$ on, by about .7 volt. This implies that $$R_3/R_L \cong R_5/R_6$$

but more precise relations are derived below. If $R_L$ decreases $Q_5$ is turned on, but normally it is non-conductive. of $Q_5$ is attained, and $Q_5$ is turned on, current responsive to $e_s$ is diverted away from the base of $Q_1$ and supplied to the load by $Q_5$.

While only one side of the circuit has been described wholly analogous events occur on the negative side of the circuit, so that current diversion occurs on both positive and negative half cycles of input signal.

The collector junction of $Q_5$ will go negative with respect to its base junction, on negative half cycles of input signal. It is necessary to prevent the collector-base circuit of $Q_5$ transferring current from base to collector, i.e. in the forward direction as seen for a diode. This is prevented by $D_1$ in the collector circuit of $Q_5$.

A diode $D_2$ is provided in the base circuit of $Q_5$, having its anode directly connected to the base, and its cathode connected to $R_6$, which in turn proceeds to ground. $D_2$ prevents the base emitter circuit of $Q_5$ avalanching in the reverse mode, and serves to decouple $Q_5$ when there is no current flow desired in $Q_5$, i.e. when the negative side of the amplifier is operating. The cathodes of $D_2$ and $D_2'$ are directly connected together by lead 10, so that $R_6$ and $R_6'$ are in parallel, and in fact only one resistance is required. This is feasible, because the + and − sides of the amplifier are operative in alternation.

$D_2$ and $D_2'$ have been bypassed by resistances $R_7$ and $R_7'$ respectively. This alters the effective volts-ampere characteristics of the transistors, providing a piece-wise non-linear network. Values of resistance in the control circuit are $$R_5=100\Omega$$

$$R_6=1.2K$$

$$R_7=470\Omega$$

For zero signal the voltage across $Z_L$ should be zero, or nearly so, i.e. the system should be balanced. Assuming V+ to be about 40 v., under signal conditions about 4 amperes of collector emitter current might flow in $Q_3$, with very low collector-emitter voltage across $Q_3$, for normal load impedance. The transistor safe operating values might be

| $V_{CE}$ | $I_E$ |
|---|---|
| 40 v. | 1.9 a. |
| 30 v. | 3.2 a. |
| 20 v. | 5.6 a. |
| 10 v. | 8.5 a. |
| 60 v. | .4 a. |
| 80 v. | .1 a. |

Plot 20 of FIG. 2 shows these values. The transistor can safely operate anywhere to the left of or below this curve. The amplifier of the invention may permit transistor current flow as follows:

| $V_{CE}$ | $I_E$ |
|---|---|
| 40 | 1.6 |
| 30 | 3 |

and therefore proceed as a straight line function 21 to about 7.5 a. at $0=V_{CE}$, and also straight line from 1.6 a. to 0 a. at 80 v., as shown at 22. We thus approximate curve 20, while remaining within the safe area for the transistor.

The nominal impedance which the amplifier sees is 6.7 ohms, and the normal swing of the amplifier is 25 v. from quiescent value.

For inductive load conditions, the voltage across $Q_3$ can exceed twice +V. Diode $D_3$ is connected from +V to the load, with its cathode connected to +V, and diode $D_3'$ is connected from −V to the same point, with its anode connected to −V. These diodes clamp the output to +V and −V when the energy from the load is transferred back into the amplifier, and thus prevent development of avalanche modes in $Q_3$ or $Q_4$, either emitter to base or emitter to collector.

The protective circuit of this invention has a bandwidth large compared to the highest signal frequency encountered. It does not impair signals in the system under normal operating conditions. It is fully automatic and does not depend on averaging signals. It releases the amplifier when the load returns to normal.

The quantitative relation $$R_3/R_L \cong R_5/R_6$$

is noted again. Were this relation precisely observed and diode $D_2$ omitted, the voltage at the base of $Q_5$ would be the same as that across $R_L$, as is also the voltage at the emitter of $Q_5$. Therefore, under normal conditions $Q_5$ is not conductive. If $R_L$ decreases sufficiently, the base to emitter voltage of $Q_5$ will increase and $Q_5$ will turn on and drain current from the base of $Q_1$, and dump that current into the load.

Assume that $Q_5$ requires about .7 v. base to emitter. for conduction to occur.

$I_E$ is the current supplied by $Q_3$
$E_3$ is the voltage across $R_3$
$E_L$ is the voltage across the load, assumed of resistance $R_2$.

$$I_E=\frac{E_3+E_L}{R_3+R_L}=\beta I_B$$

of $Q_3$ and $\beta$ is the amplification factor of $Q_1$ and $Q_3$ in combination $$I_B=\frac{e_s}{R_s}$$

Hence $$I_E=\beta\frac{e_s}{R_s}$$

The voltage across the base emitter junction of $Q_5$ is $E_2$.

$$E_2=(E_3+E_L)\frac{R_6}{R_5+R_6}-E_L$$
$$=I_E\left[(R_3+R_L)\frac{R_6}{R_5-R_6}-R_L\right]$$

Here, $E_3=I_ER_3$ and $E_L-I_ER_L$

If $E_2$ exceeds .7 v. it will conduct diverting drive current from the signal source to the load. This limits the amount of current available to drive $Q_1$. Thus the emitter current of $Q_3$ will be limited to a maximum value.

As $R_L$ is made smaller, the amount of current $I_E$ required to develop $E_2$=.7 v. reduces, thus as $R_L$ decreases the amount of maximum $I_E$ is limited to a lesser value.

In a Class B audio amplifier, as the load $R_L$ goes to a lower value, the amount of voltage swing decreases for a given drive current. Thus, when low impedance loads are presented to the amplifier the output voltage swing will be restricted and thus the voltage across the transistor will be high (since $V_{CE}$ of $Q_5 = V$ supply$-(E_3+E_L)$, and $E_L$ is small for the restricted condition mentioned).

The output transistor thus has high current flow and high voltage applied at the same time. For a given transistor type the maximum current flow and applied voltage must be limited below the dissipation limits of the transistor and also limited below the "safe area" limit for second breakdown of the transistor.

In the circuit above values of $R_3$, $R_5$ and $R_6$ can be adjusted to limit the current as desired.

The function of $D_1$ is to prevent collector current flow in $Q_5$ when the drive signal is negative. Absent $D_1$, current would flow from collector to base at $Q_5$, that circuit being a normal conductive diode for negative voltage. That current would flow through $R_5$, $R_3$ to $Z_L$ and also cause malfunction of $Q_4$ by diverting input signal current.

The function of $D_2$ is similar to that of $D_1$, i.e. it prevents reverse current flow when the voltage across $Z_L$ is negative. $D_2$ also keeps the emitter-base junction of $Q_5$ from avalanching in the reverse mode, decoupling $Q_5$ when no current flow is intended in the half of the amplifier containing $Q_3$. At the same time $D_2$ provides a piece-wise non-linear circuit for the base of $Q_5$, when $Q_3$ conducts, by bypassing $D_2$ with $R_7$.

What is claimed is:

1. A Class B transistor power amplifier, including a first power transistor having first base, emitter and collector electrodes, a second power transistor having second base, emitter and collector electrodes, said transistors being of the same type, a load terminal for connection to a load, a first sensing resistance connected directly and solely between said first emitter electrode and said load terminal, a second sensing resistance connected between said second collector electrode and said load terminal, a first voltage supply terminal of one polarity and predetermined value connected to said first collector electrode, a second voltage supply terminal of opposite polarity and equal value connected to said second emitter electrode, said sensing resistances being equal, said load terminal having a substantially zero quiescent voltage with respect to a ground point for said load, and means responsive to control voltages at said first emitter electrode and across said first sensing resistance and to control voltages at said second collector electrode and across said second sensing resistance for maintaining the voltage across and the current flow between said first collector and emitter electrodes and the voltage across and the current flow between said second collector and emitter electrodes simultaneously and individually reduced only sufficiently to remain within safe operating ranges on an instantaneous basis.

2. The combination according to claim 1, wherein is further provided a single ended drive circuit, normally non-conductive shunting transistors of opposite complementary types connected in shunt between said single ended drive circuit and said load terminal, and means responsive to said control voltages for rendering said shunting transistors conductive.

3. The combination according to claim 2, wherein each of said shunting transistors includes a collector electrode connected substantially directly to said driver circuit and an emitter circuit connected directly to said load terminal.

4. The combination according to claim 3, wherein voltage dividers are connected respectively from said first emitter electrode and said second collector electrode to ground, the bases of said shunting transistors being connected to voltage division points of said voltage dividers.

5. The combination according to claim 4, wherein said voltage dividers are piece-wise non-linear.

6. A transistor amplifier, including a voltage supply terminal, a load terminal for a load connected between said load terminal and ground, a sensing resistance, a power transistor, means connecting said power transistor and sensing resistance in series between said voltage supply terminal and said load, a normally non-conductive sensing transistor having a pair of output electrodes and a pair of input electrodes, one of each pair being the same electrode, a source of drive signal connected to drive said power transistor, means connecting said output electrodes of said sensing transistor directly in shunt between said source of drive signal and said load terminal, a voltage divider connected across said sensing resistance and load taken in series, said means connecting said input electrodes only across said sensing resistance via part of said voltage divider.

7. The combination according to claim 6, wherein said sensing transistor electrodes include an emitter electrode directly connected directly to said load and a base electrode connected to a division point of said voltage divider.

8. The combination according to claim 7 wherein the ratio of the values of the sensing resistance to the load resistance is approximately equal to the voltage division ratio of said voltage divider.

9. A protective circuit for a transistor having a drive circuit and connected in series with a load, comprising a bridge circuit, said bridge circuit including as one arm a fixed resistance and said load and as another arm a voltage divider, means for sensing unbalance of said bridge, and means responsive to said means for sensing unbalance operative on suffiicent unbalance of said bridge for bleeding current from said drive circuit into said load.

10. The combination according to claim 9 wherein said means for sensing unbalance includes the base emitter circuit of a control transistor connected across conjugate points of said bridge circuit.

11. A protective circuit for a push-pull transistor power amplifier having a single ended drive circuit, said transistor power amplifier including two series connected transistors and providing an output terminal intermediate said transistors for connection of a load circuit from said output terminal to ground, separate equal resistors connected respectively between said terminal and said transistors, separate identical voltage dividers connected respectively each across one of said equal resistors and said load, separate normally non-conductive control transistors connected to pass current in parallel from said single ended drive circuit to said output terminal, and means for controlling the conductivity of said control resistors in response to voltages at symmetrical points of said voltage dividers, respectively, selected to render said control transistors selectively increasingly conductive as the voltages across said series connected resistors represent instantaneously either an increasingly overvoltage or an increasingly overcurrent condition for either of said series connected transistors, said control transistors being of opposite conductivity types, a source of voltage connected across said control transistors in series and poled in the conductive direction, and separate diodes connected in the conductive direction in respect to said source of voltage and respectively in series with said control transistors, said separate diodes each having an electrode directly connected to said source of voltage.

References Cited

UNITED STATES PATENTS

| | | | |
|---|---|---|---|
| 3,142,807 | 7/1964 | Sharma | 330—15 |
| 3,233,115 | 2/1966 | Chou | 307—255 |
| 3,358,241 | 12/1967 | Hull | 330—15 |

NATHAN KAUFMAN, Primary Examiner

U.S. Cl. X.R.

330—24, 26, 18, 22